(12) United States Patent
Barladeanu et al.

(10) Patent No.: US 10,337,866 B2
(45) Date of Patent: Jul. 2, 2019

(54) SYSTEMS AND METHODS FOR MAGNETIC INTERFERENCE COMPENSATION OF AN EMBEDDED MAGNETOMETER

(71) Applicant: MOTOROLA SOLUTIONS, INC., Schaumburg, IL (US)

(72) Inventors: Dorian Barladeanu, Kiryat Ono (IL); Nikola Kaludjerski, Givatayim (IL); Gabi Ofir, Reshon Letzion (IL)

(73) Assignee: MOTOROLA SOLUTIONS, INC., Chicago, IL (US)

( * ) Notice: Subject to any disclaimer, the term of this patent is extended or adjusted under 35 U.S.C. 154(b) by 174 days.

(21) Appl. No.: 14/926,807

(22) Filed: Oct. 29, 2015

(65) Prior Publication Data

US 2017/0122737 A1    May 4, 2017

(51) Int. Cl.
*G01C 17/38* (2006.01)
*G01R 33/00* (2006.01)

(52) U.S. Cl.
CPC ......... *G01C 17/38* (2013.01); *G01R 33/0035* (2013.01)

(58) Field of Classification Search
CPC ............................ G01R 33/0035; G01C 17/38
See application file for complete search history.

(56) References Cited

U.S. PATENT DOCUMENTS

| | | | |
|---|---|---|---|
| 8,577,637 B2 | 11/2013 | Vogt | |
| 8,744,495 B2 * | 6/2014 | Ho | 455/456.2 |
| 8,928,309 B2 * | 1/2015 | Oliver | G01R 33/0035 324/202 |
| 2011/0077889 A1 | 3/2011 | Vogt | |
| 2012/0232838 A1 * | 9/2012 | Kemppi | G01C 17/28 702/150 |
| 2013/0155188 A1 * | 6/2013 | Heinke | H04N 5/33 348/46 |
| 2013/0320963 A1 * | 12/2013 | Carmel-Veilleux | G01R 33/0035 324/200 |
| 2015/0019159 A1 * | 1/2015 | Elgersma | G01R 35/005 702/150 |
| 2016/0327627 A1 * | 11/2016 | Almalki | G01R 35/005 |

FOREIGN PATENT DOCUMENTS

| | | |
|---|---|---|
| EP | 2677275 | 12/2013 |
| EP | 2843434 | 3/2015 |

* cited by examiner

*Primary Examiner* — Jermele M Hollington
*Assistant Examiner* — Feba Pothen
(74) *Attorney, Agent, or Firm* — Michael Best & Friedrich LLP

(57) ABSTRACT

A method and apparatus for magnetic interference compensation of an embedded magnetometer. One embodiment provides a method for operating a mobile communications device that includes an electronic processor, a memory, and a magnetometer. In one exemplary embodiment, the method includes determining, by the electronic processor, an operational mode for the mobile communication device. The method further includes retrieving, from the memory and based on the operational mode, at least one predetermined calibration parameter. The method further includes obtaining, from the magnetometer, a magnetic field reading, and determining, by the electronic processor, a calibrated magnetic field value based on the magnetic field reading and the at least one predetermined calibration parameter.

11 Claims, 6 Drawing Sheets

SYSTEMS AND METHODS FOR MAGNETIC INTERFERENCE COMPENSATION OF AN EMBEDDED MAGNETOMETER

BACKGROUND OF THE INVENTION

A magnetometer is a sensor capable of measuring magnetic flux density on one or more vectors (axes). Some mobile communications devices use embedded magnetometers to measure the Earth's magnetic field strength to provide, among other things, compass bearings. However, embedded magnetometers are subject to interference from what are commonly referred to as "hard iron" offsets and "soft iron" distortions. Hard iron offsets are created by objects that produce a magnetic field, for example, a permanent magnet in the speaker of a mobile communications device. Soft iron distortions are deflections or alterations in the magnetic field produced by ferromagnetic materials that, while they do not produce a magnetic field themselves, influence the magnetic field being measured. In a mobile communications device, such materials include, for example, metal shielding, metal fasteners, antennas, batteries, and conductors.

Because hard iron offsets are constant regardless of orientation, the values of the offsets may be determined with an accelerometer during movement of the mobile communications device. The mobile communications device may be configured to compensate for the hard iron offsets by subtracting the values from magnetometer measurements to arrive at calibrated magnetic field flux density readings. However, soft iron distortions vary with orientation, and therefore cannot be precisely determined using accelerometer readings alone. In addition, soft iron distortion effects vary with the operation of the mobile communications device.

Accordingly, there is a need for systems and methods for magnetic interference compensation of an embedded magnetometer.

BRIEF DESCRIPTION OF THE SEVERAL VIEWS OF THE DRAWINGS

The accompanying figures, where like reference numerals refer to identical or functionally similar elements throughout the separate views, together with the detailed description below, are incorporated in and form part of the specification, and serve to further illustrate embodiments of concepts that include the claimed invention, and explain various principles and advantages of those embodiments.

Figure 1:
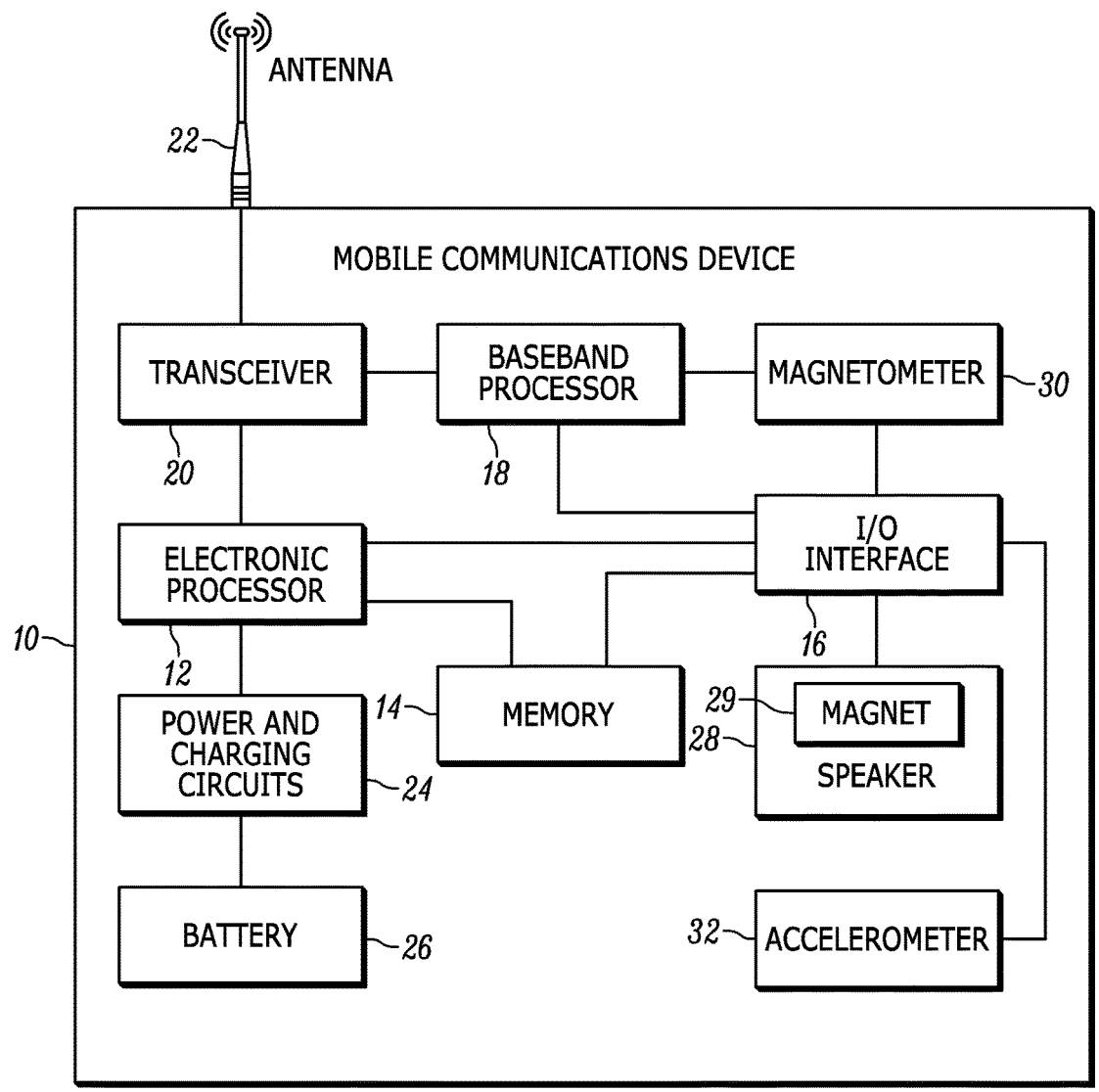
FIG. 1 is a block diagram of a mobile communications device in accordance with some embodiments.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

The apparatus and method components have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

DETAILED DESCRIPTION OF THE INVENTION

One embodiment provides a method for operating a mobile communications device that includes an electronic processor, a memory, and a magnetometer. In one exemplary embodiment, the method includes determining, by the electronic processor, an operational mode for the mobile communication device. The method further includes retrieving, from the memory and based on the operational mode, at least one predetermined calibration parameter. The method further includes obtaining, from the magnetometer, a magnetic field reading, and determining, by the electronic processor, a calibrated magnetic field value based on the magnetic field reading and the at least one predetermined calibration parameter.

Another exemplary embodiments provides a mobile communications device. The mobile communications device includes a magnetometer, a memory; and an electronic processor. The electronic processor is configured to determine an operational mode for the mobile communication device. The electronic processor is further configured to retrieve, from the memory and based on the operational mode, at least one predetermined calibration parameter. The electronic processor is further configured to obtain, from the magnetometer, a magnetic field reading; and determine a calibrated magnetic field value based on the magnetic field reading and the at least one predetermined calibration parameter.

FIG. 1 is a block diagram of a mobile communications device 10 according to one exemplary embodiment. In the example illustrated, the mobile communications device includes an electronic processor 12 (e.g., a microprocessor or another suitable programmable device), a memory 14 (e.g., a computer-readable storage medium), an input/output interface 16, a baseband processor 18 (e.g., a network modem), a transceiver 20, an antenna 22, power and charging circuits 24, a battery 26, a speaker 28, a magnetometer 30, and an accelerometer 32. In a number of the embodiments described herein, the mobile communications device 10 is a smart telephone. However, in alternative embodiments, the mobile communications device 10 is a cellular telephone, a mobile radio, a smart watch, a tablet computer, a personal digital assistant (PDA), or other mobile device that includes an embedded magnetometer.

The electronic processor 12, the memory 14, the input/output interface 16, the baseband processor 18, the transceiver 20, the antenna 22, the power and charging circuits 24, the battery 26, the speaker 28, the magnetometer 30, and the accelerometer 32, as well as other various modules and components, are coupled to each other by or through one or more control or data buses, which enable communication therebetween. The memory 14 may include a program storage area (e.g., read only memory (ROM) and a data storage area (e.g., random access memory (RAM), and another non-transitory computer readable medium. The electronic processor 12 is coupled to the memory 14 and executes computer readable instructions ("software") stored in the memory 14. For example, software for performing methods as described hereinafter may be stored in the memory 14. The software may include one or more applications, program data, filters, rules, one or more program modules, and/or other executable instructions.

The input/output interface 16 operates to receive user input, to provide system output, or a combination of both. User input may be provided via, for example, a keypad, a microphone, softkeys, icons, or softbuttons on a touch screen, a scroll ball, buttons, and the like. System output may be provided via a display device such as a liquid crystal display (LCD), touch screen, and the like (not shown). The input/output interface 16 may also include other input mechanisms, for example, sound or light sensors, which for brevity are not described herein and which may be implemented in hardware, software, or a combination of both.

The input/output interface 16 may include a graphical user interface (GUI) (e.g., generated by the electronic processor 12, from instructions and data stored in the memory 14, and presented on a touch screen) that enables a user to interact with the mobile communications device 10. The baseband processor 18 is configured to encode and decode digital data sent and received by the transceiver 20 to and from various wireless communications networks via the antenna 22.

The power and charging circuits 24 are coupled to the battery 26 to provide electrical power to the various components of the mobile communications device 10 through one or more power buses. The battery 26 is rechargeable and receives power from the power and charging circuits 24, which are operable to charge the battery 26 using power received from external sources. The speaker 28 is conventional, and will not be described in greater detail.

In the embodiment shown, the magnetometer 30 is a sensor capable of measuring magnetic field flux density in three (3) perpendicular axes (that is, X, Y, and Z) in and around the mobile communications device 10. The magnetometer 30 is capable of transmitting the measurements to the electronic processor 12 via the input/output interface 16. The accelerometer 32 is a sensor capable of measuring directional movement of the mobile communications device 10 in 3 axes (that is, X, Y, and Z). The accelerometer 32 is capable of transmitting the measurements the electronic processor 12 via the input/output interface 16. In some embodiments, the magnetometer 30 and the accelerometer 32 are integrated into a single device (for example, an electronic compass).

Figure 2:
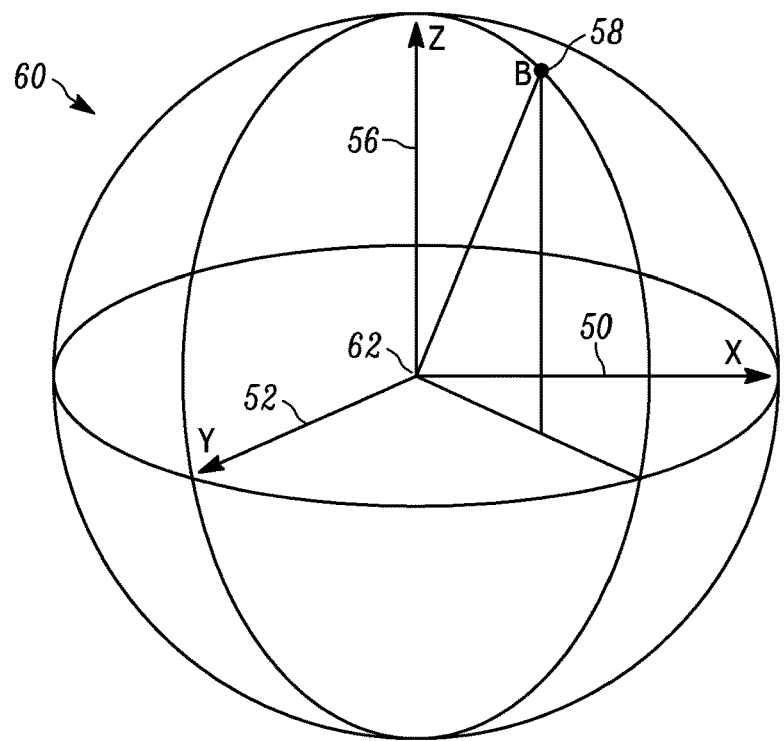
FIG. 2 illustrates a magnetic field in a three-dimensional coordinate system.

In one exemplary embodiment, electronic processor 12 is configured to interpret measurements from the magnetometer 30 to provide an indication of the mobile communications device's position within the Earth's magnetic field, for example, a compass heading. The magnetometer 30 measures magnetic field flux density, in microteslas (µT), as illustrated in FIG. 2, for each of three axes: the X-axis 50 ($B_X$), the Y-axis 52 ($B_Y$), and the Z-axis 56 ($B_Z$). The measurements ($B_X$, $B_Y$, $B_Z$) are components of a magnetic field flux density vector (B). Under ideal conditions, the measurements ($B_X$, $B_Y$, $B_Z$) have a geometric locus (for example, point 58) on a sphere 60, which is centered on a center point 62. However, embedded magnetometers do not operate in ideal conditions, and are subject to interference effect from hard iron offsets and soft iron distortions.

Figure 3:
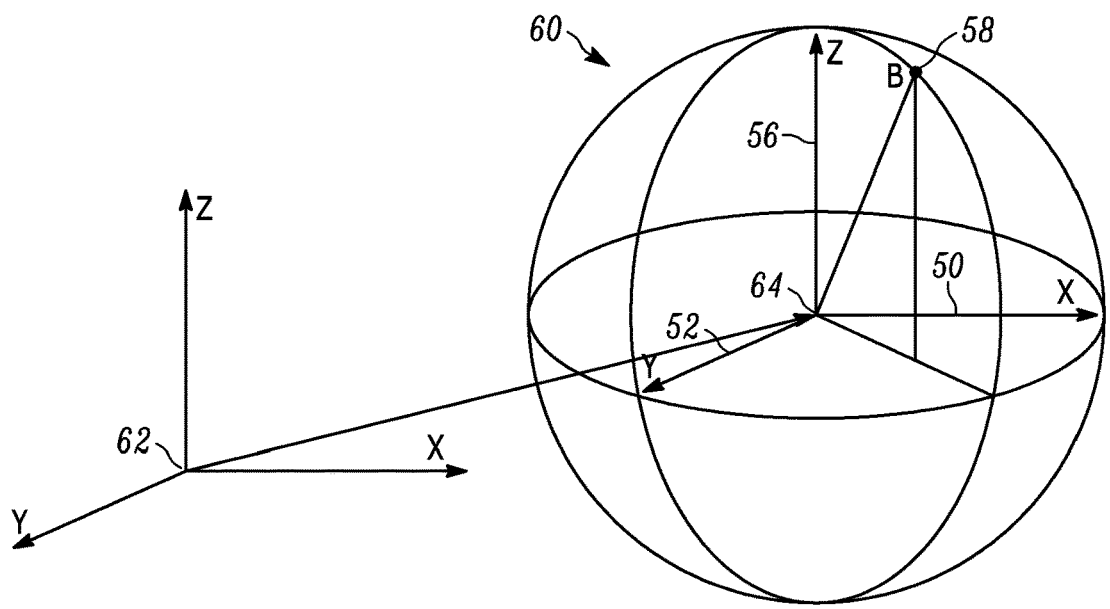
FIG. 3 illustrates a magnetic field in a three-dimensional coordinate system and affected by hard iron offsets.

Returning now to FIG. 1, hard iron offsets are created by objects that produce a magnetic field apart from the one being measured. For example, the permanent magnet 29 in the speaker 28 produces a constant magnetic field. Other objects internal to the mobile communications device 10 can create magnetic fields that produce hard iron offsets. The internal magnetic fields combine to form a total hard iron offset. This total hard iron offset affects the measurements made by the magnetometer 30. As a consequence, the electronic processor 12 produces inaccurate compass headings. As illustrated in FIG. 3, the total hard iron offset displaces the sphere 60. The field strength measurements assume the sphere 60 is still centered on the center point 62. However, the total hard iron offset has displaced the sphere 60, centering it on offset center point 64. The offset center point 64 is offset from the center point 62 by an offset amount for the X-axis 50, the Y-axis 52, and the Z-axis 56. The offset amounts for each axis may differ from each other, but each individual offset remains constant. Accordingly, when the offset amounts for each axis are known, those offsets may be used to adjust the measurements to correct for the offset. As understood by one skilled in the art, the individual offsets may be determined using magnetometer measurements and accelerometer readings gathered as the mobile communications device 10 is moved (for example, by rotating the mobile communications device 10 through at least 360 degrees).

Figure 4:
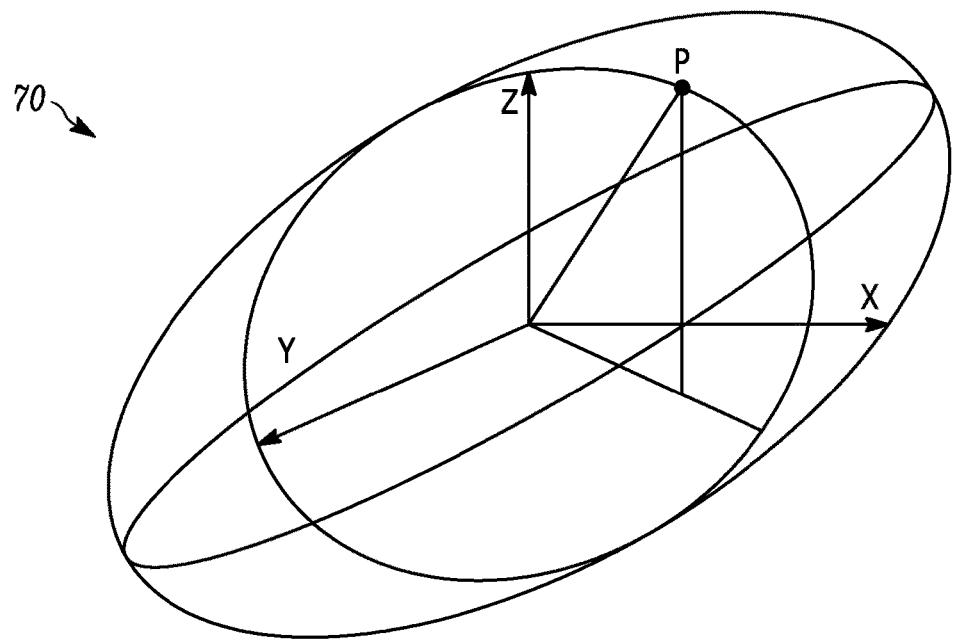
FIG. 4 illustrates a magnetic field in a three-dimensional coordinate system and affected by soft iron distortion.

Soft iron distortions are caused by ferromagnetic materials that influence the magnetic field in the vicinity of the magnetometer 30. As illustrated in FIG. 4, soft iron distortion is asymmetric, causing the sphere 60 to deform into an ellipsoid 70, the axes of which are rotated relative to the axes of the magnetometer 30. Soft iron distortion can be caused by inactive components, for example, shielding, fasteners, and other ferromagnetic components. Soft iron distortion can also be caused by active components, for example, the electronic processor 12, the baseband processor 18, the transceiver 20, the power and charging circuits 24, the battery 26, and other electrical components.

Figure 5:
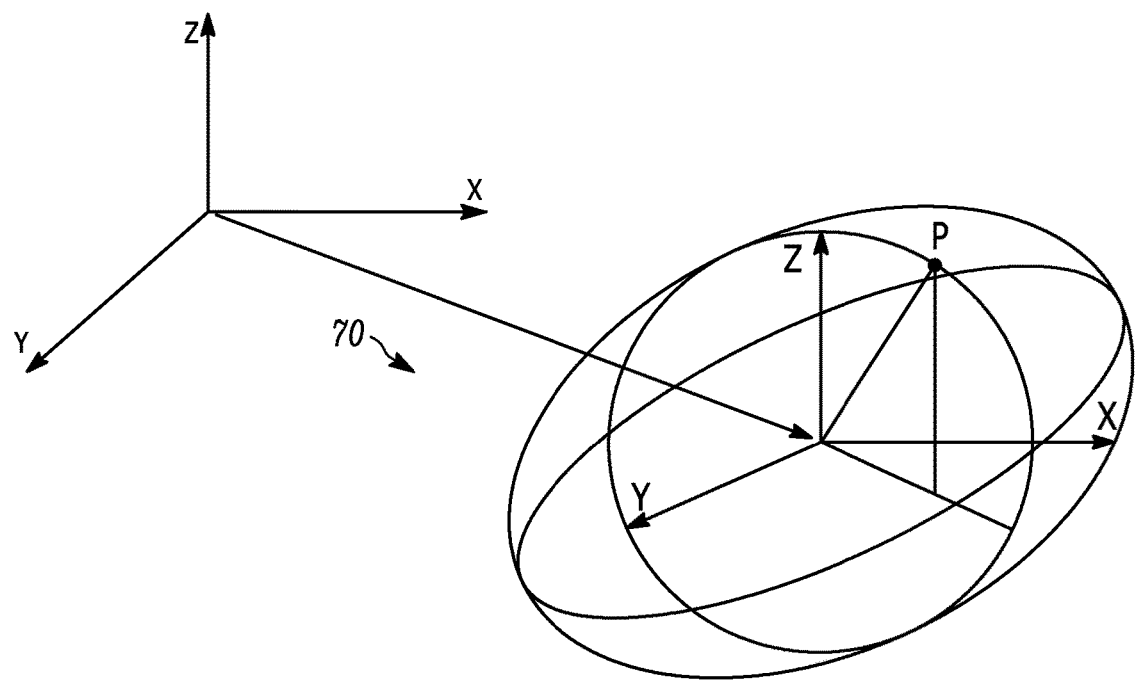
FIG. 5 illustrates a magnetic field affected in a three-dimensional coordinate system and by hard iron offsets and soft iron distortion.

The hard iron offsets and soft iron distortions act together to interfere with the operation of the magnetometer 30. As illustrated in FIG. 5, the sphere 60 is deformed, rotated, and offset. In order to produce an accurate compass heading, the electronic processor 12 must compensate for both the offset, rotation, and the shape of the ellipsoid 70.

Figure 6:
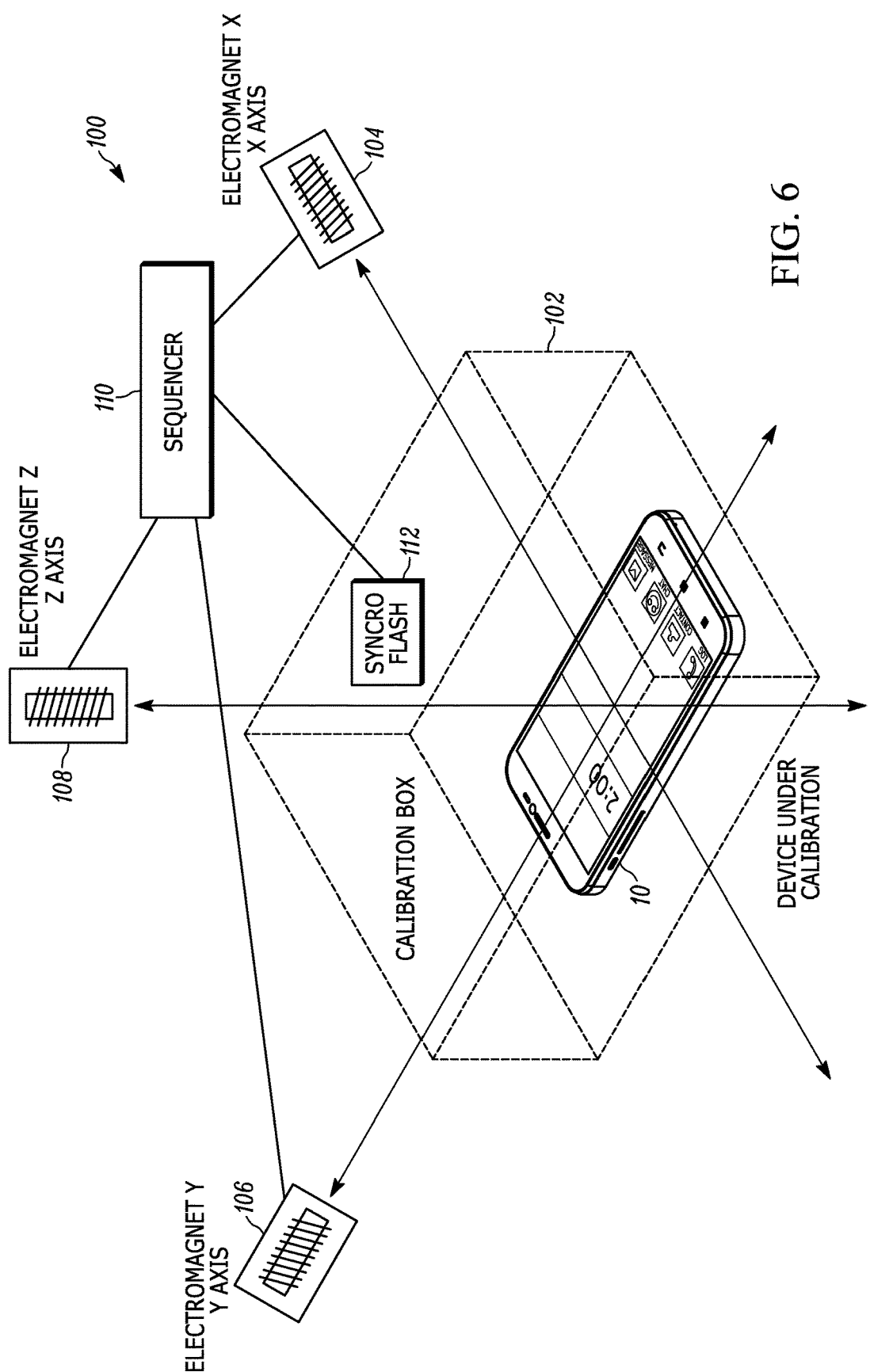
FIG. 6 is a diagram of a system for calibrating a magnetometer embedded in the mobile communications device of FIG. 1 in accordance with some embodiments.

FIG. 6 illustrates an exemplary embodiment of a calibration system 100 for calibrating the mobile communications device 10 to compensate for hard iron offsets and soft iron distortions. The calibration system 100 includes a calibration box 102, an X-axis electromagnet 104, a Y-axis electromagnet 106, a Z-axis electromagnet 108, a sequencer 110, and a synchro flash 112. The calibration box 102, the X-axis electromagnet 104, the Y-axis electromagnet 106, the Z-axis electromagnet 108, the sequencer 110, and the synchro flash 112, as well as other various modules and components, are connected by one or more links or control, data, and/or power buses, which enable control of the components and communication therebetween.

The calibration box 102 is constructed of plastic or another suitable non-magnetic material. The calibration box 102 is of sufficient size to enclose the mobile communications device 10. The calibration box 102 is configured such that the mobile communications device 10 may be securely positioned to remain stationary during calibration. The calibration box 102 may also contain a suitable mechanism (not shown) for rotating the mobile communications device 10. As illustrated, the calibration box 102 is rectangular in shape. In alternative embodiments, the calibration box 102 may vary in shape.

The X-axis electromagnet 104, the Y-axis electromagnet 106, the Z-axis electromagnet 108 are positioned along their respective axes, as illustrated in FIG. 6, and are capable of generating various magnetic fields when energized by the sequencer 110. The magnetic fields generated by the X-axis electromagnet 104 ($B_X$), the Y-axis electromagnet 106 ($B_Y$), and the Z-axis electromagnet 108 ($B_Z$) combine to generate a magnetic field flux density vector (B).

The sequencer 110 includes various components, which for brevity are not described herein and which may be implemented in hardware, software, or a combination of both. The sequencer 110 is electrically coupled to other systems (not shown), which can send and receive information (including control information) to and from the sequencer 110. The sequencer 110 is capable of variably energizing the X-axis electromagnet 104, the Y-axis electromagnet 106, and the Z-axis electromagnet 108 to create the components of, and thus generate, a magnetic field with a flux density vector (B) of a known value. The sequencer 110 is configured to generate a plurality of different magnetic field flux density vectors, each having a different geometric locus on the ideal sphere as described above. The sequencer 110 is configured to generate each of the plurality of magnetic field flux density vectors for a predetermined period of time in a predetermined sequence. In some embodiments, the sequencer 110 is further configured to repeat the predetermined sequence for a predetermined number of iterations.

The sequencer 110 is configured to control the synchro flash 112. In the embodiment shown, the synchro flash 112 acts as a trigger or initiation device. The synchro flash 112 may be a strobe light, or other suitable controllable light source. The synchro flash 112 is positioned within the calibration box 102 such that the light it produces can be detected by a light sensor of the mobile communications device 10. Some embodiments include more than one synchro flash 112. Triggering mechanisms other than the synchro flash 112 and light sensor described may be used in the initiate the process of calibrating the magnetometer.

Figure 7:
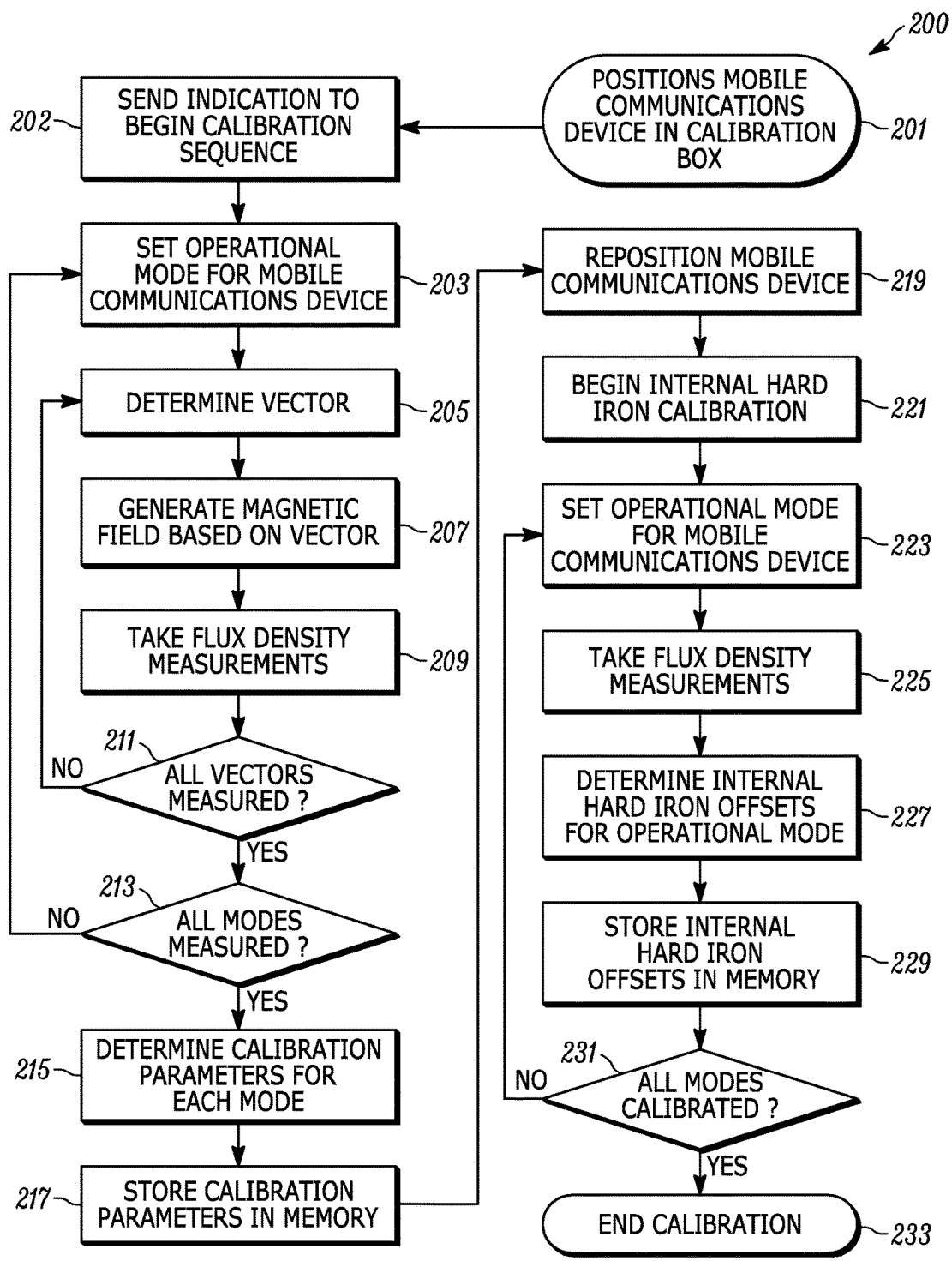
FIG. 7 is flowchart of a method for calibrating a magnetometer embedded in the mobile communications device of FIG. 1 to compensate for total hard iron offsets and soft iron distortion in accordance with some embodiments.

FIG. 7 illustrates one exemplary method 200 that may be utilized by the system 100 for calibrating the magnetometer 30 of the mobile communications device 10. Other methods are possible. Prior to calibration, the mobile communications device 10 is securely positioned in the calibration box 102 in a first orientation, at block 201. At block 202, the sequencer 110 uses the synchro flash 112 to send an indication (for example, a flash of light) to the mobile communications device 10 to initiate the calibration sequence. As noted, in alternative embodiments, other mechanisms may be used to initiate the start of the calibration sequence. The indication is used to synchronize the calibration sequence between the sequencer 110 and the mobile communications device 10. As described in detail below, the sequencer 110 and the mobile communications device 10 perform similar sequences in a synchronized fashion to achieve calibration. The sequencer 110 is configured to generate a plurality of particular magnetic fields, each during a predetermined period, and the mobile communications device 10 is to take measurements, using the magnetometer 30, of each magnetic field. The sequencer 110 and the mobile communications device 10 are configured to begin their respective sequences when the indication to begin is sent and received, taking into account any delay between sending and receiving.

Soft iron distortion effects are strongly dependent on the operation of the electrical components of the mobile communications device 10, for example, the electronic processor 12, the baseband processor 18, the transceiver 20, the power and charging circuits 24, the battery 26, and other components. Therefore, the magnetometer 30 may need to be calibrated differently depending on what mode is active for the mobile communications device 10. Accordingly, in some embodiments, the calibration sequence may repeat for a plurality of operational modes. Operational modes may include a selectable mode of the mobile communications device 10 (for example, airplane mode), a status of a component of the mobile communications device 10 (for example, the intensity of the screen backlight, disabled or enable wireless networks), an active function of the mobile communications device 10 (for example, transmitting data, transmitting audio, charging the battery), or combinations of the foregoing. Different configurations of the mobile communications device 10 may be calibrated for different modes depending on the intended application of the mobile communications device 10. For example, a land mobile radio intended for public safety uses may benefit from accurate compass readings while the radio is transmitting. Returning now to FIG. 7, when the mobile communications device 10 receives the indication to begin, it starts the calibration sequence by setting an operational mode at block 203 (that is, activating or setting the mode, status or function).

As noted above, the sequencer 110 is configured to generate a plurality of known flux density vectors. In one exemplary embodiment, the sequencer 110 will generate sixteen flux density vectors. Alternative embodiments may use more or fewer flux density vectors. At block 205, the sequencer 110 determines which flux density vector to generate. The sequencer 110 will begin the sequence with the first flux density vector. At block 207, the sequencer 110 will energize the X-axis electromagnet 104, the Y-axis electromagnet 106, and the Z-axis electromagnet 108 to generate a magnetic field with the determined flux density vector. At block 209, the magnetometer 30 will take flux density measurements for the magnetic field produced by the sequencer 110, and the electronic processor 12 will store those measurements in the memory 14. It should be noted that each flux density vector generated will be of sufficient magnitude (for example, 100 μT) to minimize external magnetic influences, including the Earth's magnetic field. As illustrated in FIG. 7, blocks 205 through 209 will repeat until the entire plurality of flux density vectors has been generated and measured, at block 211.

As illustrated in FIG. 7, blocks 203 through 211 are repeated for each of a plurality of operational modes until a plurality of flux density measures have been generated and measured for each operational mode, at block 213.

At block 215, the electronic processor 12 determines the calibration parameters for each operational mode. The soft iron interference calibration parameters are coefficients ($\alpha 1$, $\alpha 2$, $\alpha 3$, $\beta 1$, $\beta 2$, $\beta 3$, $\gamma 1$, $\gamma 2$, $\gamma 3$). The hard iron interference calibration parameters are deltas ($\delta 1$, $\delta 1$, $\delta 1$).

For each operational mode, sixteen flux density vectors were generated and measured. Each of the sixteen flux density vectors generated has a value ($B_{estimated}$) that would have been measured in an ideal situation (that is, absent any interference). However, each flux density vector has a measured value ($B_{measured}$), which varies from $B_{estimated}$ due to interference. $B_{estimated}$ is made up of an x-axis component ($B_{Xestimated}$), a y-axis component ($B_{Yestimated}$), and a z-axis component ($B_{Zestimated}$). Similarly, $B_{measured}$ is made up of an x-axis component ($B_{Xmeasured}$), a y-axis component ($B_{Ymeasured}$), and a z-axis component ($B_{Zmeasured}$).

Using the components of $B_{measured}$ and $B_{estimated}$, the electronic processor 12 can determine the calibration parameters by solving the following linear equations:

$$B_{Xestimated}(k)=\alpha 1 * B_{Xmeasured}(k)+\beta 1 * B_{Ymeasured}(k)+\gamma 1 * B_{Zmeasured}(k)+\delta 1$$

$$B_{Yestimated}(k)=\alpha 2 * B_{Xmeasured}(k)+\beta 1 * B_{Ymeasured}(k)+\gamma 1 * B_{Zmeasured}(k)+\delta 2$$

$$B_{Zestimated}(k)=\alpha 3 * B_{Xmeasured}(k)+\beta 3 * B_{Ymeasured}(k)+\gamma 3 * B_{Zmeasured}(k)+\delta 3$$

where (k) is the number of the flux density vector.

In the exemplary embodiment, where k=sixteen, the determination of the calibration parameters is based on solving three systems of sixteen linear equations, each with four unknowns. Skilled artisans will appreciate that this can be accomplished using a pseudoinverse algorithm (for example, the Moore-Penrose matrix inverse algorithm). The above calculations are repeated for each of the operational modes calibrated. The calibration parameters are stored in the memory 14, along with an indicator of which mode they are to be used with, at block 217, and the calibration sequence ends at block 219.

The hard iron calibration parameters ($\delta 1$, $\delta 1$, $\delta 1$) determined above compensate for the total hard iron offsets. This includes the hard iron offsets internal to the mobile communications device 10 and the hard iron offsets generated externally in the area where the calibration occurred (for example, a manufacturing facility). To isolate the internal hard iron offsets, the external hard iron offsets must be detected and removed from the total hard iron offsets.

As noted above, the method 200 begins with the mobile communications device 10 positioned in an initial orientation (for example, with the screen facing up). At block 219, the mobile communications device 10 is repositioned in the calibration box 102 so that it is oriented with the screen facing down (that is, rotated 180 degrees in the y-axis from its initial orientation). In some embodiments, the repositioning is accomplished automatically. In alternative embodiments, the mobile communications device 10 is repositioned manually. The sequencer 110 does not generate magnetic fields during the remainder of calibration sequence. Because the mobile communications device 10 is in the same position, but oriented 180 degrees opposite from its initial orientation, the internal hard iron offsets will remain the same, but the external hard iron offsets will be reversed in sign.

At block 221, internal hard iron calibration begins. In some embodiments, this happens automatically when the accelerometer 32 and the electronic processor 12 determine that the mobile communications device 10 has been repositioned. In alternative embodiments, the calibration sequence is triggered with a suitable input such as triggering via the synchro flash 112. For each of the operational modes calibrated at blocks 203-213, the electronic processor 12 will determine internal hard iron offsets ($B_X0$, $B_Y0$, $B_Z0$). At block 223, the electronic processor 12 sets the mobile communications device 10 to one of the operational modes. At block 225, the magnetometer 30 measures the external magnetic field flux density, $B_{measured}$, made up of an x-axis component ($B_{Xmeasured}$), a y-axis component ($B_{Ymeasured}$), and a z-axis component ($B_{Zmeasured}$).

At block 227, the electronic processor 12 determines the internal hard iron offsets ($B_X0$, $B_Y0$, $B_Z0$) for that operational mode using the coefficients determined for that mode and the following equations:

$$B_X0=(\delta 1+\varphi 1)/2$$

$$B_Y0=(\delta 2+\varphi 2)/2$$

$$B_Z0=(\delta 1+\varphi 3)/2$$

where $\varphi 1$ $\varphi 2$ $\varphi 3$ are calculated using:

$$0=\alpha 1 * B_{Xmeasured}(k)+\beta 1 * B_{Ymeasured}(k)+\gamma 1 * B_{Zmeasured}(k)+\varphi$$

$$0=\alpha 2 * B_{Xmeasured}(k)+\beta * B_{Ymeasured}(k)+\gamma 1 * B_{Zmeasured}(k)+\varphi 2$$

$$0=\alpha 3 * B_{Xmeasured}(k)+\beta * B_{Ymeasured}(k)+\gamma 3 * B_{Zmeasured}(k)+\varphi 3$$

The internal hard calibration parameters for the operational mode are stored in the memory 14, at block 229. As illustrated in FIG. 7, blocks 223 through 231 repeat until all operational modes have been fully calibrated. At block 233, the calibration sequence ends, and the mobile communications device 10 may be removed from the calibration box 102.

Figure 8:
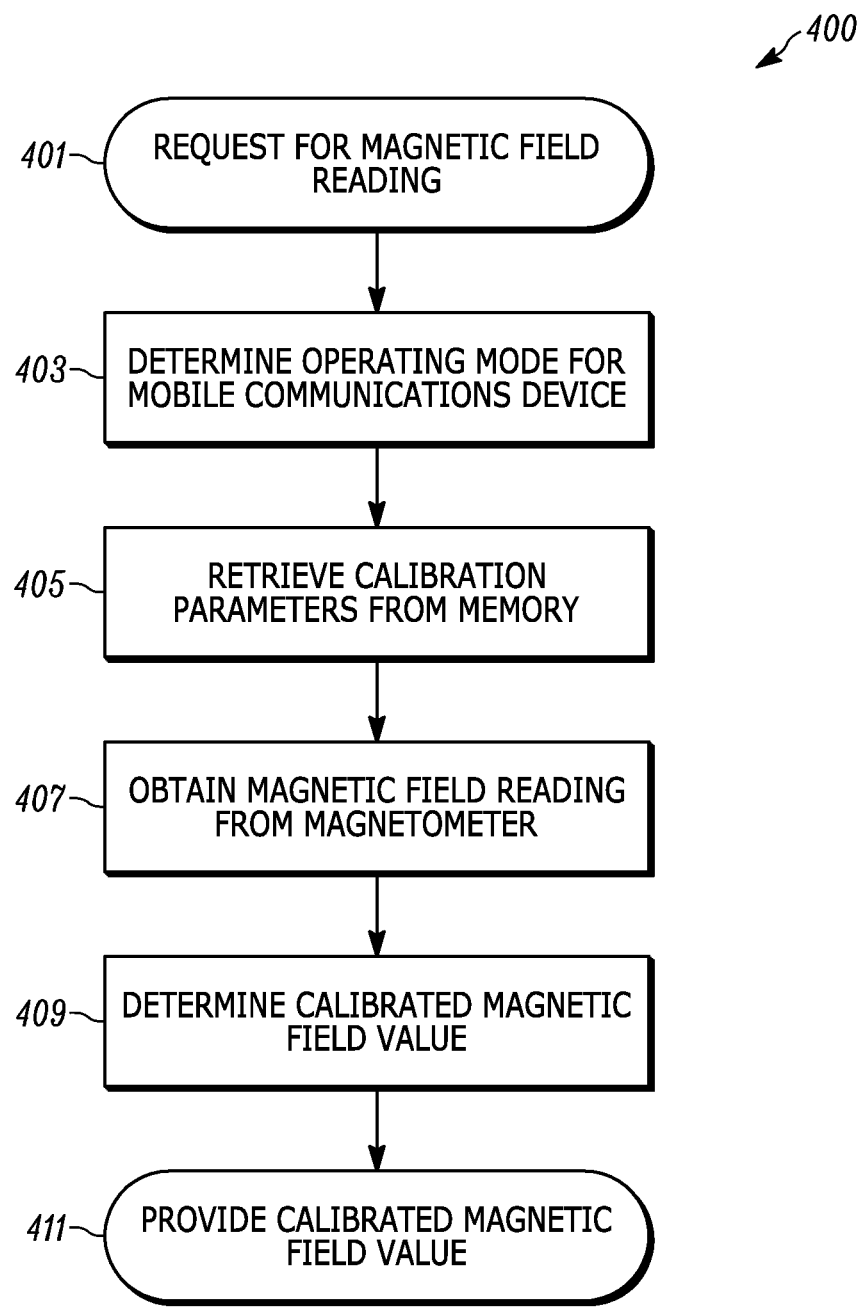
FIG. 8 is flowchart of a method for operating the mobile communications device of FIG. 1 in accordance with some embodiments.

FIG. 8 illustrates an exemplary embodiment of a method 400 for operating the mobile communications device 10 using the calibration parameters determined using method 200. At block 401, the electronic processor 12 receives a request for a magnetic field reading from a component of the mobile communications device 10. The component may be hardware, software (for example, an application running on the mobile communications device 10), or a combination of both. At block 403, the electronic processor 12 determines the operational mode for the device. As noted above, the operational mode may be a selectable mode of the mobile communications device 10, a status of a component of the mobile communications device 10, an active function of the mobile communications device 10, or some combination of the foregoing. For example, to determine the operational mode, the electronic processor 12 may determine a battery charger status, a media player status, an operating mode (for example, a device such as a smart telephone will know that it is in "airplane" mode), a radio network status (for example, whether the transceiver 20 is using a particular wireless network modality), a screen backlight brightness, a short-range wireless network status (for example, whether Bluetooth™ is active), or a tethering status.

As noted above, a plurality of predetermined calibration parameters for each operational mode are stored in the memory 14. At block 405, the electronic processor 12 retrieves calibration parameters from the memory 14 based on the operational mode. At block 407, the electronic processor obtains a magnetic field reading ($B_{measured}$) from the magnetometer 30. At block 409 the electronic processor 12 determines a calibrated magnetic field value ($B_{cal}$) using the components of $B_{measured}$, the calibration parameters retrieved at block 407, and the following equations:

$$B_{Xcal}=\alpha 1 * B_{Xmeasured}+\beta 1 * B_{Ymeasured}+\gamma 1 * B_{Zmeasured}+\delta 1-B_X0$$

$$B_{Ycal}=\alpha 2 * B_{Xmeasured}+\beta 2 * B_{Ymeasured}+\gamma 2 * B_{Zmeasured}+\delta 2-B_Y0$$

$$B_{Zcal}=\alpha 3 * B_{Xmeasured}+\beta 3 * B_{Ymeasured}+\gamma 3 * B_{Zmeasured}+\delta 3-B_Z0$$

where $B_{Xcal}$, $B_{Ycal}$, and $B_{Zcal}$ are the x-axis, y-axis, and z-axis components, respectively, of $B_{cal}$. At block 411, the electronic processor 12 provides $B_{cal}$ to the component that requested the magnetic field reading at block 401.

The same configuration of components within the mobile communications device 10 will produce different soft iron distortion effects, depending on where among those components the magnetometer 30 is positioned. The systems and methods described herein may be used to determine the best positioning of the magnetometer 30 when designing the mobile communications device 10 (for example, in the position which experiences the least hard iron offsets and soft iron distortion). For example, the placement of the magnetometer 30 may be determined by determining which position (out of a plurality of the possible positions) minimizes the standard deviation of the calibrated parameters of a number of devices from the same family.

The systems and methods described herein may be used to determine the calibration parameters for each individual mobile communications device manufactured. In some embodiments, the calibration parameters for a family of mobile communications devices may be determined by averaging the calibration parameters for a suitable quantity of such devices. Accordingly, mass production of calibrated mobile communications devices could be accomplished without individually calibrating the devices during production. Similarly, already-deployed mobile communications devices could be calibrated, or receive updated calibration parameters, using, for example, software or firmware updates.

In the foregoing specification, specific embodiments have been described. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of present teachings.

The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

Moreover in this document, relational terms such as first and second, top and bottom, and the like may be used solely to distinguish one entity or action from another entity or action without necessarily requiring or implying any actual such relationship or order between such entities or actions. The terms "comprises," "comprising," "has", "having," "includes", "including," "contains", "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element proceeded by "comprises . . . a", "has . . . a", "includes . . . a", "contains . . . a" does not, without more constraints, preclude the existence of additional identical elements in the process, method, article, or apparatus that comprises, has, includes, contains the element. The terms "a" and "an" are defined as one or more unless explicitly stated otherwise herein. The terms "substantially", "essentially", "approximately", "about" or any other version thereof, are defined as being close to as understood by one of ordinary skill in the art, and in one non-limiting embodiment the term is defined to be within 10%, in another embodiment within 5%, in another embodiment within 1% and in another embodiment within 0.5%. The term "coupled" as used herein is defined as connected, although not necessarily directly and not necessarily mechanically. A device or structure that is "configured" in a certain way is configured in at least that way, but may also be configured in ways that are not listed.

It will be appreciated that some embodiments may be comprised of one or more generic or specialized processors (or "processing devices") such as microprocessors, digital signal processors, customized processors and field programmable gate arrays (FPGAs) and unique stored program instructions (including both software and firmware) that control the one or more processors to implement, in conjunction with certain non-processor circuits, some, most, or all of the functions of the method and/or apparatus described herein. Alternatively, some or all functions could be implemented by a state machine that has no stored program instructions, or in one or more application specific integrated circuits (ASICs), in which each function or some combinations of certain of the functions are implemented as custom logic. Of course, a combination of the two approaches could be used.

Moreover, an embodiment can be implemented as a computer-readable storage medium having computer readable code stored thereon for programming a computer (e.g., comprising a processor) to perform a method as described and claimed herein. Examples of such computer-readable storage mediums include, but are not limited to, a hard disk, a CD-ROM, an optical storage device, a magnetic storage device, a ROM (Read Only Memory), a PROM (Programmable Read Only Memory), an EPROM (Erasable Programmable Read Only Memory), an EEPROM (Electrically Erasable Programmable Read Only Memory) and a Flash memory. Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

We claim:

1. A method for operating a mobile communications device that includes an electronic processor, a memory, and a magnetometer, the method comprising:
    determining, by the electronic processor, an active operational mode of at least one electrical component of the mobile communication device;

retrieving, from the memory and based on the active operational mode, at least one predetermined calibration parameter for compensating for a magnetic field distortion caused by the at least one electrical component while in the active electronic operational mode;

obtaining, from the magnetometer, a magnetic field reading; and determining, by the electronic processor, a calibrated magnetic field value for the magnetic field reading based on the at least one predetermined calibration parameter to calibrate the magnetometer;

wherein determining an active operational mode includes determining at least one selected from the group consisting of a radio network status, a tethering status, a screen backlight brightness, a short-range wireless network status, a media player status, and a battery charger status.

2. The method of claim 1, wherein the at least one predetermined calibration parameter includes at least one selected from the group consisting of at least one soft iron interference calibration parameter and at least one hard iron interference calibration parameter.

3. The method of claim 1, further comprising receiving, by the electronic processor, a request for a magnetic field reading; and providing, by the electronic processor, the calibrated magnetic field value to a component of the mobile communication device.

4. The method of claim 1, wherein the magnetic field reading is a magnetic field flux density vector.

5. The method of claim 1, wherein the magnetometer is a 3-axis magnetometer.

6. A mobile communications device, the mobile communications device comprising:

a magnetometer;

a memory; and an electronic processor configured to determine an active operational mode for at least one electrical component of the mobile communication device;

retrieve, from the memory and based on the active operational mode, at least one predetermined calibration parameter for compensating for a magnetic field distortion caused by the at least one electrical component while in the active electronic operational mode;

obtain, from the magnetometer, a magnetic field reading; and determine a calibrated magnetic field value for the magnetic field reading based on the at least one predetermined calibration parameter to calibrate the magnetometer, wherein determining an active operational mode includes determining at least one selected from the group consisting of a radio network status, a tethering status, a screen backlight brightness, a short-range wireless network status, a media player status, and a battery charger status.

7. The device of claim 6, wherein the at least one predetermined calibration parameter includes at least one selected from the group consisting of at least one soft iron interference calibration parameter and at least one hard iron interference calibration parameter.

8. The device of claim 6, wherein the electronic processor is further configured to receive a request for a magnetic field reading; and provide the calibrated magnetic field value to a component of the mobile communication device.

9. The device of claim 6, further comprising an electronic compass, wherein the magnetometer is incorporated into the electronic compass.

10. The device of claim 6, wherein the magnetic field reading is a magnetic field flux density vector.

11. The device of claim 6, wherein the magnetometer is a 3-axis magnetometer.

* * * * *